US009416487B2

(12) United States Patent
Jakli et al.

(10) Patent No.: US 9,416,487 B2
(45) Date of Patent: Aug. 16, 2016

(54) SUPER-PIEZOELECTRIC COMPOSITE FIBER MATS FOR POWER GENERATION AND SOFT ACTUATORS

(71) Applicant: KENT STATE UNIVERSITY, Kent, OH (US)

(72) Inventors: Antal I. Jakli, Kent, OH (US); Ebru Aylin Buyuktanir, Massillon, OH (US); John L. West, Harville, OH (US); Jason Morvan, Twinsburg, OH (US); John Ernest Harden, Jr., Streetsboro, OH (US)

(73) Assignee: Kent State University, Kent, OH (US)

( * ) Notice: Subject to any disclaimer, the term of this patent is extended or adjusted under 35 U.S.C. 154(b) by 83 days.

(21) Appl. No.: 14/051,763

(22) Filed: Oct. 11, 2013

(65) Prior Publication Data

US 2015/0102704 A1 Apr. 16, 2015

(51) Int. Cl.
| | |
|---|---|
| *H01L 41/18* | (2006.01) |
| *D06M 23/08* | (2006.01) |
| *H01L 41/37* | (2013.01) |
| *H01L 41/08* | (2006.01) |
| *D01D 5/00* | (2006.01) |
| *D01F 1/10* | (2006.01) |
| *D01F 6/62* | (2006.01) |

(52) U.S. Cl.
CPC ............. *D06M 23/08* (2013.01); *D01D 5/0007* (2013.01); *D01F 1/10* (2013.01); *D01F 6/625* (2013.01); *H01L 41/082* (2013.01); *H01L 41/183* (2013.01); *H01L 41/37* (2013.01)

(58) Field of Classification Search
CPC ...... H01L 41/18; H01L 41/183; H01L 41/193
USPC .................................................. 310/358, 800
See application file for complete search history.

(56) References Cited

U.S. PATENT DOCUMENTS

| | | | |
|---|---|---|---|
| 2011/0109204 A1* | 5/2011 | Tajitsu et al. ................. | 310/348 |
| 2012/0133247 A1* | 5/2012 | Lee et al. ...................... | 310/339 |

OTHER PUBLICATIONS

Andrew, et al. "Effect of electrospinning on the Ferroelectric Phase content of Polyvinylidene Difluoride fibers" Langmuir 2008, vol. 24, pp. 670-672.
"Barium Titanate" Wikipedia, Retrieved from http://en.wikipedia.org/wiki/Barium_titanate on Oct. 9, 2013, pp. 1-4.
Bognitzki, et al. "Nanostructured fibers via electrospinning" Advanced Materials 2001, 13(1), 70-72.
(Continued)

*Primary Examiner* — Derek Rosenau
(74) *Attorney, Agent, or Firm* — Fay Sharpe LLP

(57) ABSTRACT

A piezoelectric device includes a fiber mat comprising polymer fibers with ferroelectric particles embedded in the polymer fibers. The ferroelectric particles are oriented to generate a net polarization in the fiber mat. The ferroelectric particles may comprise barium titanate particles. The polymer fibers may comprise polylactic acid (PLA) fibers. The piezoelectric device may further include substrates sandwiching the fiber mat, and the fiber mat may be formed by electrospinning polymer fibers containing ferroelectric particles onto one of the substrates. The piezoelectric device may be a piezoelectric actuator configured to receive an input voltage applied across the fiber mat and to output a mechanical displacement in response to the voltage, or the piezoelectric device may be configured to output a voltage in response to a mechanical force applied to the fiber mat.

21 Claims, 8 Drawing Sheets

(56) References Cited

OTHER PUBLICATIONS

Buyuktanir, et al. "Liquid crystal microfibers lead to responsive optoelectronic textiles" SPIE 2012, pp. 1-3.

Fukada, et al. "New piezoelectric polymers" Jpn. J. Appl. Phys., 1998, vol. 37, Pt. 1, No. 5B, pp. 2775-2780.

Dzenis, Y. "Spinning continuous fibers for nanotechnology" Science 2004, vol. 304, ]pp. 1917-1919.

Greiner, et al. "Electrospinning: a fascinating method for preparation of ultrathin fibers" Angew. Chem. Int. Ed. 2007, vol. 46, pp. 5670-5703.

Huang, et al. "Electrospinning of polyvinylidene difluoride with carbon nanotubes: synergistic effects of extensional force and interfacial interaction on Crystalline Structures" Langmuir 2008, pp. 13621-13626.

Huang, et al. "Electrospun polymer nanofibers with small diameters" Nanotechnology, 2006, vol. 17, pp. 1558-1563.

Lim, et al. "Processing technologies for poly(lactic acid)" Progress in Polymer Science, 2008, vol. 33, pp. 820-852.

Liu, et al. "Cooperative effect of electrospinning and nanoclay on formation of polar crystalline phases in poly(vinylidene fluoride)" Applied Materials & Interfaces, 2010, vol. 2, No. 6, pp. 1759-1768.

Nakiri, et al. "Piezoelectric characteristics of chiral polymer composite films obtained under strong magnetic field" Japan Society of Applied Physics, 2005, vol. 44, No. 9B, pp. 7119-7122.

Reneker, et al. "Electrospinning jets and polymer nanofibers" Polymer 2008, vol. 49, pp. 2387-2425.

Rutledge, et al. "Formatoin of fibers by electrospinning" Advanced Drug Delivery Reviews, 2007, vol. 59, pp. 1384-1391.

Sasaki, et al. "Helix distortion and crystal structure of the α-Form of Poly(L-lactide)" Macromolecules 2003, vol. 36, pp. 8385-8390.

Subbiah, et al. "Electrospinning of nanofibers" Journal of Applied Polymer Science, 2005, vol. 96, pp. 557-569.

Wada, et al. "Enhanced piezoelectric property of barium titanate single crystals with engineered domain configuration" Jpn. J. Appl. Phys. 1999, vol. 38, pp. 5505-5511.

Wang, et al. "Enhancement of electrical properties of ferroelectric polymers by polyaniline nanofibers with controllable conductivitie" Adv. Funct. Mater. 2008, vol. 18, pp. 1299-1306.

Wang, et al. "Synthesis and characterization of micro/nanoscopic $Pb(Zr_{0.52}Ti_{0.48})O_3$ fibers by electrospinning" Appl. Phys. A 78, 2004, pp. 1043-1047.

Xie, et al. "Electrospinning and multiferroic properties of $NiFe_2O_4$-$Pb(Zr_{0.52}Ti_{0.48})O_3$ composite nanofibers" Journal of Applied Physics, vol. 104, 2008, pp. 1-7.

* cited by examiner

SUPER-PIEZOELECTRIC COMPOSITE FIBER MATS FOR POWER GENERATION AND SOFT ACTUATORS

This application claims the benefit of U.S. Provisional Application No. 61/744,871 filed Oct. 12, 2012 and titled "SUPER-PIEZOELECTRIC COMPOSITE FIBER MATS FOR POWER GENERATION AND SOFT ACTUATORS". U.S. Provisional Application No. 61/744,871 filed Oct. 12, 2012 and titled "SUPER-PIEZOELECTRIC COMPOSITE FIBER MATS FOR POWER GENERATION AND SOFT ACTUATORS" is hereby incorporated by reference in its entirety into the specification of this application.

BACKGROUND

The following relates to the piezoelectric material arts, sensor arts, actuator arts, and related arts.

Piezoelectric materials produce a voltage in response to an applied mechanical force, or conversely compress or expand in response to an applied voltage. Such materials are used in diverse applications, such as pressure sensors, touch-sensitive buttons or other user interface controls, audio speakers, microphones, actuators, and so forth.

BRIEF SUMMARY

In some illustrative embodiments disclosed herein, a piezoelectric device includes a fiber mat comprising polymer fibers with ferroelectric particles embedded in the polymer fibers, and electrically conductive substrates sandwiching the fiber mat. In some embodiments the ferroelectric particles embedded in the polymer fibers are poled such that the fiber mat has a net polarization $\vec{P}$ oriented normal to surfaces of the electrically conductive substrates. In some embodiments the ferroelectric particles comprise barium titanate particles. In some embodiments the polymer fibers comprise polylactic acid (PLA) fibers. In some embodiments the fiber mat is formed by electrospinning polymer fibers containing ferroelectric particles onto one of the electrically conductive substrates. In some embodiments the electrically conductive substrates include at least one substrate comprising glass coated with indium tin oxide (ITO). In some embodiments the piezoelectric device comprises a piezoelectric actuator configured to receive an input voltage and output a mechanical displacement in response to the received input voltage. In some embodiments the piezoelectric device is configured to output a voltage in response to an applied mechanical force. Various combinations of the foregoing embodiments are also contemplated.

In some illustrative embodiments disclosed herein, a method comprises forming a piezoelectric device by operations including: forming an electrospun fiber mat on a substrate by electrospinning source material comprising polymer and ferroelectric particles onto the substrate; and arranging electrodes respective to the electrospun fiber mat such that at least one of (1) a force applied to the fiber mat generates a voltage over the electrodes via piezoelectric action of the fiber mat and (2) a voltage applied across the electrodes generates expansion or contraction of the fiber mat by converse piezoelectric action. In some embodiments the electrospinning includes applying a voltage between a syringe used in the electrospinning and the substrate effective to (1) produce electrospinning and (2) induce self-poling in the ferroelectric particles of the electrospun fiber mat.

In some illustrative embodiments disclosed herein, a piezoelectric device includes a fiber mat comprising polymer fibers with ferroelectric particles embedded in the polymer fibers. The ferroelectric particles are oriented to generate a net polarization in the fiber mat. In some embodiments the ferroelectric particles comprise barium titanate particles. In some embodiments the polymer fibers comprise polylactic acid (PLA) fibers. In some embodiments the fibers of the fiber mat lack any long-range order. In some embodiments the piezoelectric device further includes substrates sandwiching the fiber mat, and the fiber mat is formed by electrospinning polymer fibers containing ferroelectric particles onto one of the substrates. Various combinations of the foregoing embodiments are also contemplated.

DETAILED DESCRIPTION

Figure 1:
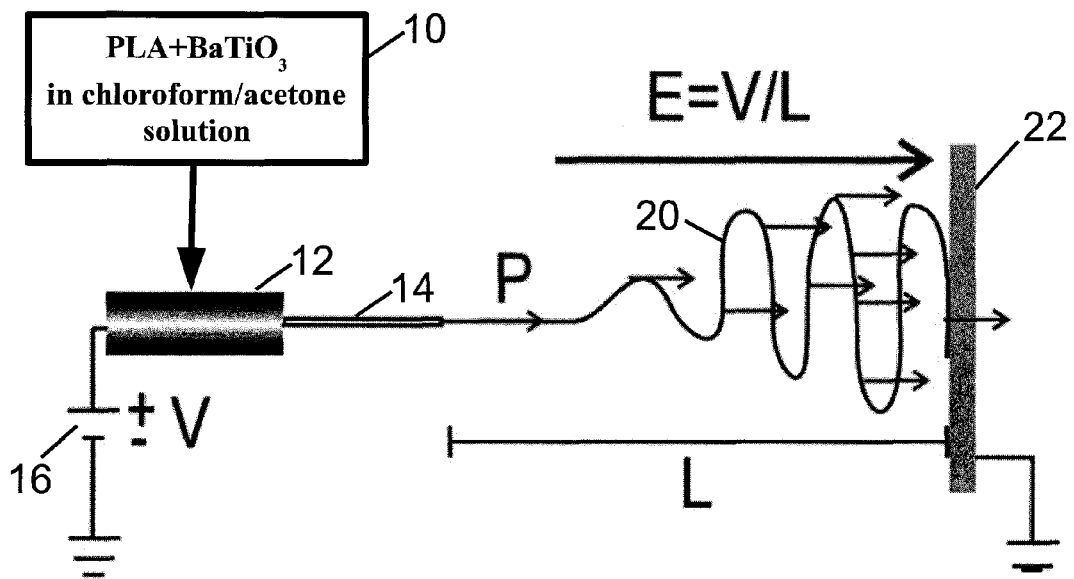
FIG. 1 diagrammatically shows an electrospinning system for manufacturing piezoelectric fiber pads as disclosed herein.

Disclosed herein is a cloth like material (also called a "fiber mat" herein) that can produce a voltage when depressed via super-piezoelectricity. The voltage from a single layer can be easily detected and is greater than 2 volts, which is sufficient to switch a typical liquid crystal device (LCD) display. In converse mode an applied voltage causes the material to move. The material is an electrospun fiber mat that incorporates ferroelectric barium titanate nanoparticles (BaTiO$_3$). As disclosed herein, the linear electromechanical responses of the fiber mats have an effect that is orders of magnitude larger than pure BaTiO$_3$ films. This enhanced piezoelectric effect, also called "super-piezoelectric" effect herein, is believed to be due to a phenomenon in which electrospinning poles the particles while the fiber is being formed. The fibers in turn produce a huge surface area in a small space. The net result is a material that is easy to manufacture, that is highly efficient, and that yields a substantial weight savings.

Textiles designed to flex or change shape can be made from responsive fibers that contract or expand upon application of an electric field. The electrospun ferroelectric nanofibers disclosed herein offer a myriad of opportunities in fields such as materials engineering and device technologies. For example, responsive fibers are suitable for developing electrically active textiles for applications including non-volatile memory devices, artificial muscles, sensors, and fiber actuators at a relatively low cost.

Electrospinning is suitable for forming fibers with diameters ranging from tens of nanometers to several micrometers, which in the electrospinning technique are drawn electrostatically through a high electric voltage gradient generated between a charged polymeric fluid and a collection plate. Several examples of ultrafine ferroelectric, ferromagnetic, and their composite nanofibers have been fabricated by the combination of a sol-gel and electrospinning process. See Xie et al., "Electrospinning and multiferroic properties of $NiFe_2O_4$—$Pb(Zr_{0.52}Ti_{0.48})O_3$ composite nanofibers", J. Appl. Phys. vol. 104, page 024115 (2008); Wang et al., "Synthesis and characterization of micro/nanoscopic $Pb(Zr_{0.52}Ti_{0.48})O_3$ fibers by electrospinning", Appl. Phys. A vol. 78, pages 1043-47 (2004). In those studies, composite fibers were annealed at several hundred degrees Celsius to create fully crystallized ceramic nanofibers. In the process, the polymer matrix has been removed completely. While the nonwoven ceramic fiber mats present ferroelectric properties, they become brittle due to the lack of self-supporting and flexible polymer shells. Chen et al., "Nanogenerator for Mechanical Energy Harvesting Using PZT Nanofibers", Nano Lett. vol. 10, pages 2133-37 (2010). Researchers have also reported on the electrospinning of the ferroelectric polymer, polyvinylidene fluoride (PVDF), which can efficiently convert electrical energy to mechanical energy while maintaining enough flexibility to sustain the actuation strain. Huang et al., "Electrospinning of Polyvinylidene Difluoride with Carbon Nanotubes: Synergistic Effects of Extensional Force and Interfacial Interaction on Crystalline Structures", Langmuir vol. 24, pages 13621-26 (2008); Wang et al., "Enhancement of Electrical Properties of Ferroelectric Polymers by Polyaniline Nanofibers with Controllable Conductivities", Adv. Funct. Mater. vol. 18, 1299-1306 (2008); Liu et al., "Cooperative Effect of Electrospinning Nanoclay on Formation of Polar Crystalline Phases in Poly(vinylidene fluoride)", Appl. Mater. and Interfaces vol. 2 no. 6, pages 1759-68 (2010). Wide-angle X-ray diffraction (WAXD) and Fourier transform infrared (FTIR) studies on electrospun PVDF have revealed that electrospinning increased the formation of ferroelectric β phase which has the largest spontaneous polarization increased. Andrew et al., "Effect of Electrospinning on the Ferroelectric Phase Content of Polyvinylidene Difluoride Fibers", Langmuir vol. 24, pages 670-672 (2008).

Disclosed herein are ferroelectric and piezoelectric responses of composite electrospun fibers that are able to produce orders of magnitude larger piezoelectric response per weight than pure piezoelectric ceramic films. Results are presented herein on composites of highly flexible and bendable structures of polylactic acid (PLA), and ferroelectric $BaTiO_3$ nanoparticles. Piezoelectric behavior of the PLA/$BaTiO_3$ nonwoven mats was quantitatively measured using a Mirau interferometer (see FIG. 8). The resulting fibers respond to both the magnitude and polarity of the applied field (converse effect). Piezoelectric response was found to be larger than of the constituent $BaTiO_3$ nanoparticles. This unexpected high piezoelectric response, referred to herein as super-piezoelectricity, is believed to be explained by the enormously large surface area of the particles in the mat. Experimental results disclosed herein demonstrate that electrospinning can be used to fabricate lightweight and responsive, and soft piezoelectric actuators and sensors. In addition, the direct effect (mechanical stress or strain produces an electric field or voltage) was studied and found to be a very significant effect, producing over 5 volts depending on the stress applied. The disclosed fiber mats and corresponding fabrication techniques disclosed herein have substantial advantages, including: ease of manufacturing; ability to leverage existing technologies such as electrospinning and roll-to-roll systems to manufacture large-area, e.g. meter wide, sheets; the disclosed fiber mats are thirty (30) times lighter than current polyvinylidenflouride (PVDF)-based piezoelectric sheets; the disclosed fiber mat manufacturing process is performed at room temperature as compared to manufacture at temperatures near the Curie point for known PVDF-based piezoelectric sheet manufacturing processes; electrical poling occurs is in same processing operation as fiber production (that is, the process is "self-poling"); the disclosed fiber mats are flexible as compared to crystalline piezoelectrics; and as compared to crystalline piezoelectrics, crystalline defects are not an issue in the disclosed fiber mats.

With reference to FIG. 1, source material 10 is provided, comprising piezoelectric particles in a polymer solution. In the experiments reported herein, the piezoelectric particles were barium titanate ($BaTiO_3$) nanoparticles and the polymer was polylactic acid (PLA); however, other ferroelectric particles are suitably used as the piezoelectric particles, and other polymers may be used for the fiber matrix. For the fiber mat experiments reported herein, the source material 10 was polylactic acid (PLA) ($M_w$=186,000, $M_w/M_n$=1.76) obtained from Cargill Dow LLC in Minnetonka, Minn., USA. Barium titanate ($BaTiO_3$), chloroform, and acetone were obtained from Sigma-Aldrich (St. Louis, Mo.) and used as received. PLA was dissolved in a chloroform/acetone solution (3:1 volume ratio) at a concentration of 10 wt-%, for example. $BaTiO_3$ was then added to the solution and the PLA/$BaTiO_3$ suspension (at various concentrations for various experiments, 10 wt-% being an illustrative example) was mechanically stirred using a (Fisher Model 210T automatic stirring apparatus for two days at room temperature. For comparative purposes, neat PLA source material was prepared, e.g. a 10 wt-.% pure PLA solution prepared in chloroform/acetone and electrospun under the same conditions as used for the piezoelectric fiber mats containing $BaTiO_3$.

With continuing reference to FIG. 1, the electrospinning set-up is diagrammatically indicated in FIG. 1, and included a KDS Model 100 programmable syringe pump 12 feeding a syringe 14, and a high-voltage power supply 16 (Gamma High Voltage Research Inc., FL) driving the syringe pump 12. For the experiments reported herein, the syringe 14 was a Popper Micro-mate 5 mL glass syringe with a 24-gauge metal needle. Electrospun fibers 20 were collected on a substrate (i.e. collector) 22 held at ground potential as shown in FIG. 1. In various experiments reported herein the substrate 22 was a copper plate, an indium-tin-oxide (ITO) coated glass substrate (Corning, 1,1 mm thick), or a thin copper wire mounted on a glass cover slip (Fisher Scientific). The PLA/$BaTiO_3$ (52/48 wt. %) suspension 10 was drawn into the syringe 14 and injected with a metal needle using the syringe pump 12. The fibers 20 were electrospun at a rate of 0.4 mL/h at a tip-to-collector separation of L=10 cm. The voltage applied by the voltage source 16 was varied from 18 to 25 kV. As indicated in FIG. 1, and without loss of generality, the electric potential across the tip-to-collector gap is denoted V, and the electric field E in the gap is given by E=V/L.

It will be appreciated that the source material 10 may employ other piezoelectric particles besides barium titanate, and/or the electrospun fibers may comprise a polymer other than PLA, and/or other solvents may be used for the source material. For example, other piezoelectric particles may be used in place of or in addition to barium titanate, such as particles of lead scandium tantalite (also called PST), lithium niobate ($LiNbO_3$), lithium tantalite ($LiTaO_3$), sodium tungstate ($Na_2WO_3$), zinc oxide (ZnO), $Ba_2NaNb_5O_5$, $Pb_2KNb_5O_{15}$, or so forth. Similarly, other polymers such as polyvinylidene fluoride or polyvinylidene difluoride (PVDF), polyvinyl alcohol or another polymer suited for fiber spinning can be employed in place of the PVA of the illustrative examples. The foregoing manufacturing parameters are merely illustrative, and are suitably optimized for a given application and for a given source material (e.g., a different voltage and/or collector and/or tip-to-collector separation distance may be optimal for a source material comprising a different piezoelectric particle type and/or a different polymer matrix).

Experiments were performed on fiber mats fabricated in accord with the foregoing process or variants thereof as set forth in the description of the experimental results, in order to quantify the (direct) piezoelectric effect and the converse effect.

Figures 2, 3:
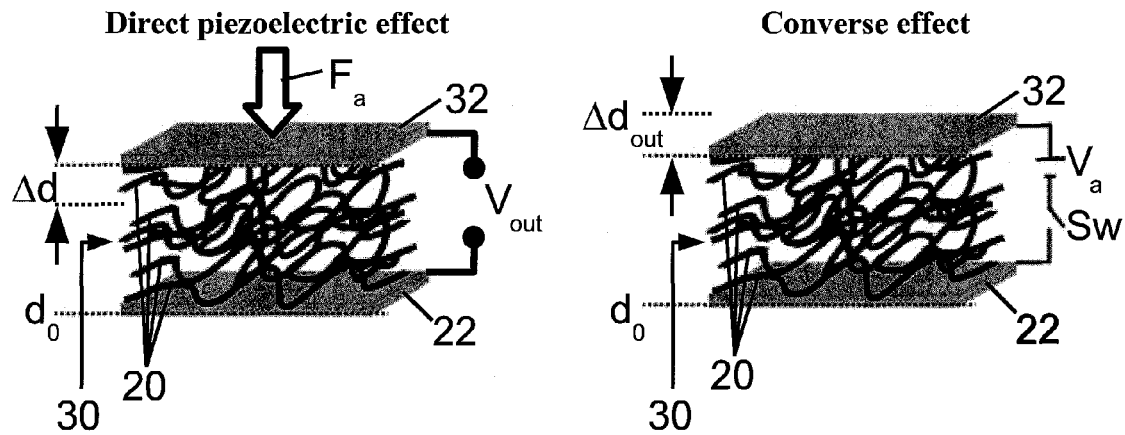
FIG. 2 diagrammatically shows a test device configured to measure the direct piezoelectric effect.
FIG. 3 diagrammatically shows a test device configured to measure the converse effect.

With reference to FIG. 2, a test device is diagrammatically shown configured to measure the direct piezoelectric effect. The device includes a fiber mat 30 comprising fibers 20 deposited on a collector substrate 22 in accordance with the process described with reference to FIG. 1. To permit detection of piezoelectric voltage, the substrate 22 is suitably electrically conductive, e.g. a copper plate or an ITO-coated glass substrate, and a second electrically conductive substrate 32 is placed on top of the fabricated fiber mat 30 so that the fiber mat 30 is sandwiched between the two electrically conductive substrates 22, 32. In tests of the piezoelectric effect, a mechanical force $F_a$ (e.g. compression pulse) is applied to the fiber mat 30 via the substrates 22, 32 and a resulting voltage $V_{out}$ is measured. In this approach the lower substrate 22 is resting on a hard surface, not shown, such that the lower substrate 22 is kept at a fixed position $d_0$, and the applied force $F_a$ compresses the fiber mat 30 between the substrates 22, 32 to produce a change in thickness $\Delta d$ of the fibermat 30. This thickness change produces the output voltage $V_{out}$ by action of the(direct) piezoelectric effect. (The effect is due to the change in thickness $\Delta d$ of the fiber mat 30—the experimental setup fixes the lower substrate 22 at a reference position $d_0$ only for experimental convenience.)

With reference to FIG. 3, the test device is diagrammatically shown configured to measure the converse effect. The device again includes the fiber mat 30 comprising fibers 20 deposited on the collector substrate 22, with the top substrate 32 again employed. To permit application of a voltage $V_a$ to generate the converse effect, the substrates 22. 32 are again suitably electrically conductive, e.g. a copper plate or an ITO-coated glass substrate. In tests of the converse effect, a voltage $V_a$ is applied, which causes a change in thickness $\Delta d_{out}$ of the fiber mat 30. In the converse effect, this change in thickness $\Delta d_{out}$ is the experimental output. In experiments reported herein, the change in thickness $\Delta d_{out}$ is measured using a Leitz Mirau interferometer described elsewhere herein with reference to FIG. 8. Because the converse effect occurs in response to a transient voltage, the applied voltage $V_a$ is applied as a pulse, for example using a diagrammatically indicated switch Sw. (Again, the output is the change in thickness $\Delta d_{out}$ of the fiber mat 30, and the lower substrate 22 is fixed at the reference position $d_0$ only for convenience in measuring $\Delta d_{out}$.) Alternatively, the applied voltage $V_a$ may be an a.c. voltage (see experimental setup of FIG. 8 as an example).

With reference to FIGS. 4-7, tests demonstrating the direct piezoelectric effect, that is, demonstrating generation of large voltage in response to an applied force, are described.

Figure 4:
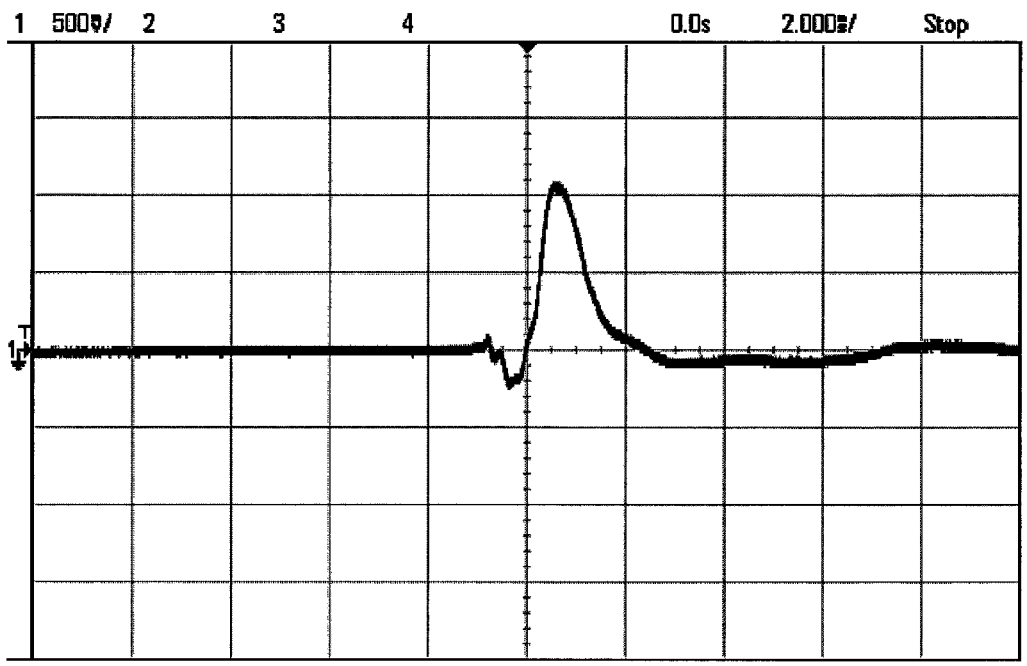
FIGS. 4-7 present experimental test results demonstrating the direct piezoelectric effect of test devices configured as shown in FIG. 2.
Figure 5:
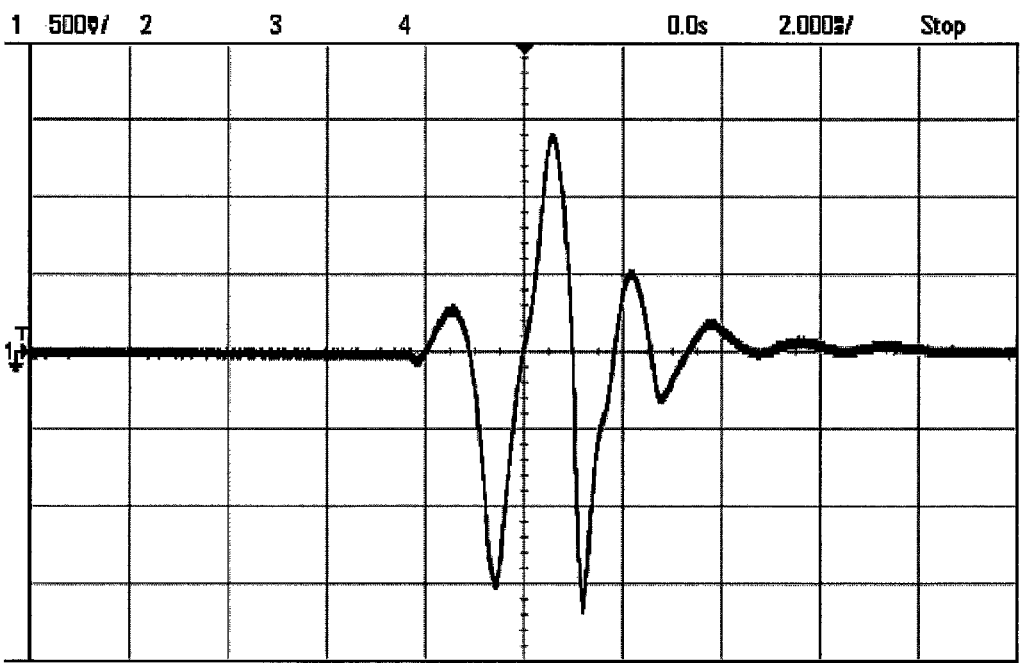

FIGS. 4 and 5 present a comparison of the piezoelectric effect of the fiber mat 30 (FIG. 5) with the piezoelectric effect of a commercially available flexible piezoelectric device (Measurement Specialties TM DT series piezo sensor) typically used in electric switches (FIG. 4). A simple pushing on the material with a finger was used to create the applied force $F_a$ (see FIG. 2). The voltage-versus-time plots shown in FIGS. 4 and 5 were measured using an oscilloscope. Both the commercially available device (FIG. 4) and the fiber mat 30 of the present disclosure (FIG. 5) yield about 1.5V with a simple finger press. The fiber mat 30 whose test result is reported in FIG. 5 is sandwiched between 1 mm glass substrates 22, 32, while the commercial device is on a flexible substrate about 0.1 mm thick.

Figure 6:
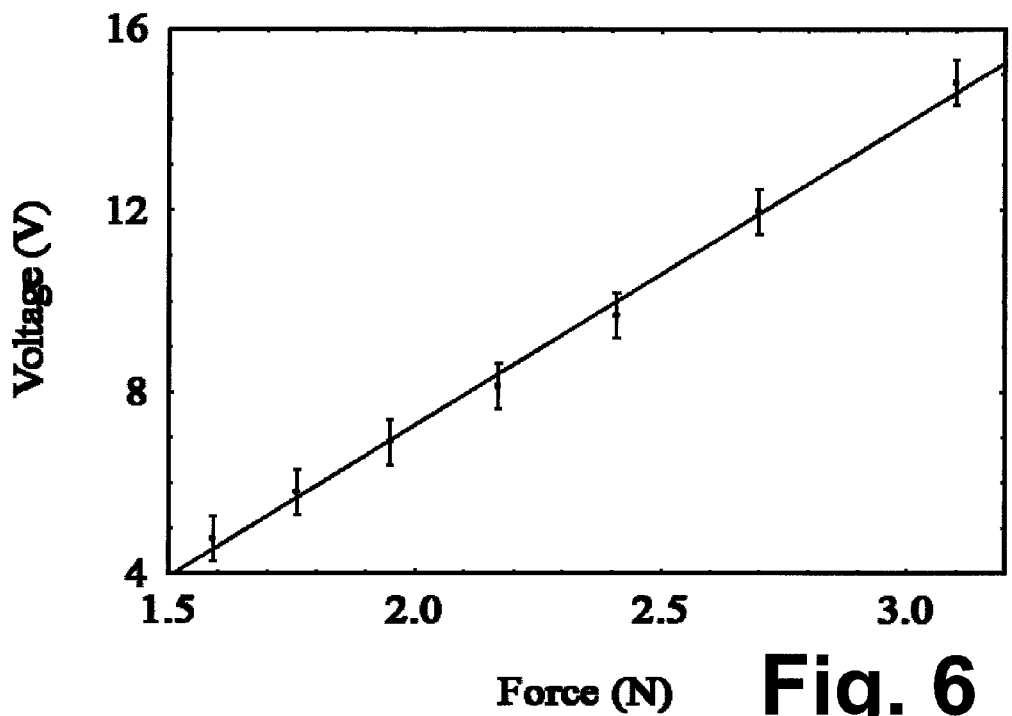

FIG. 6 presents quantitative results for the fiber mat 30 in the form of a voltage ($V_{out}$) versus applied force ($F_a$) plot produced by pressing on the fiber mat 30 with a known force. A substantial voltage was produced, as seen in FIG. 6. As further seen in FIG. 6, the response is linear. The observed voltages are sufficient to switch a LCD display.

Figure 7:
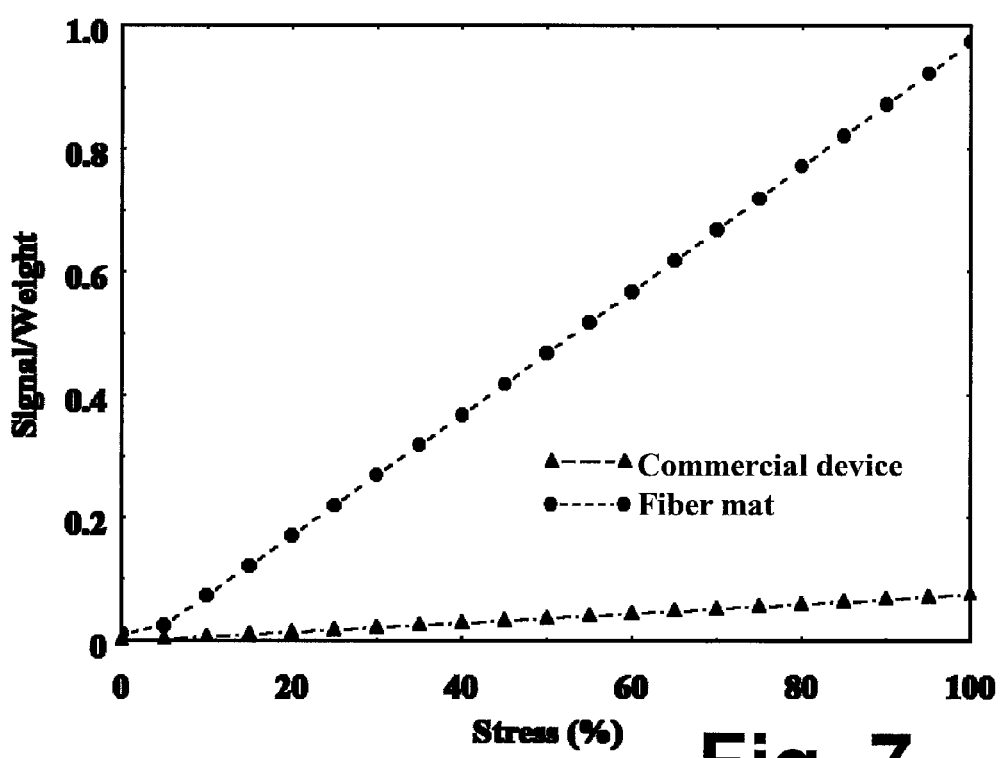

With reference to FIG. 7, performance of the fiber mat 30 versus the commercially available flexible piezoelectric device (labeled "Commercial device" in the legend of FIG. 7—Measurement Specialties TM DT series piezo sensor) was compared over a large range of applied stresses. In FIG. 7, the weight is divided out to show that "pound for pound" the fiber mat 30 outperformed the commercial device by a factor of ten (10).

In summary, experiments of the direct piezoelectric effect reported with reference to FIGS. 4-7 show that the performance of the fiber mat 30 is at least comparable with competing technology already in mass production.

Figure 8:
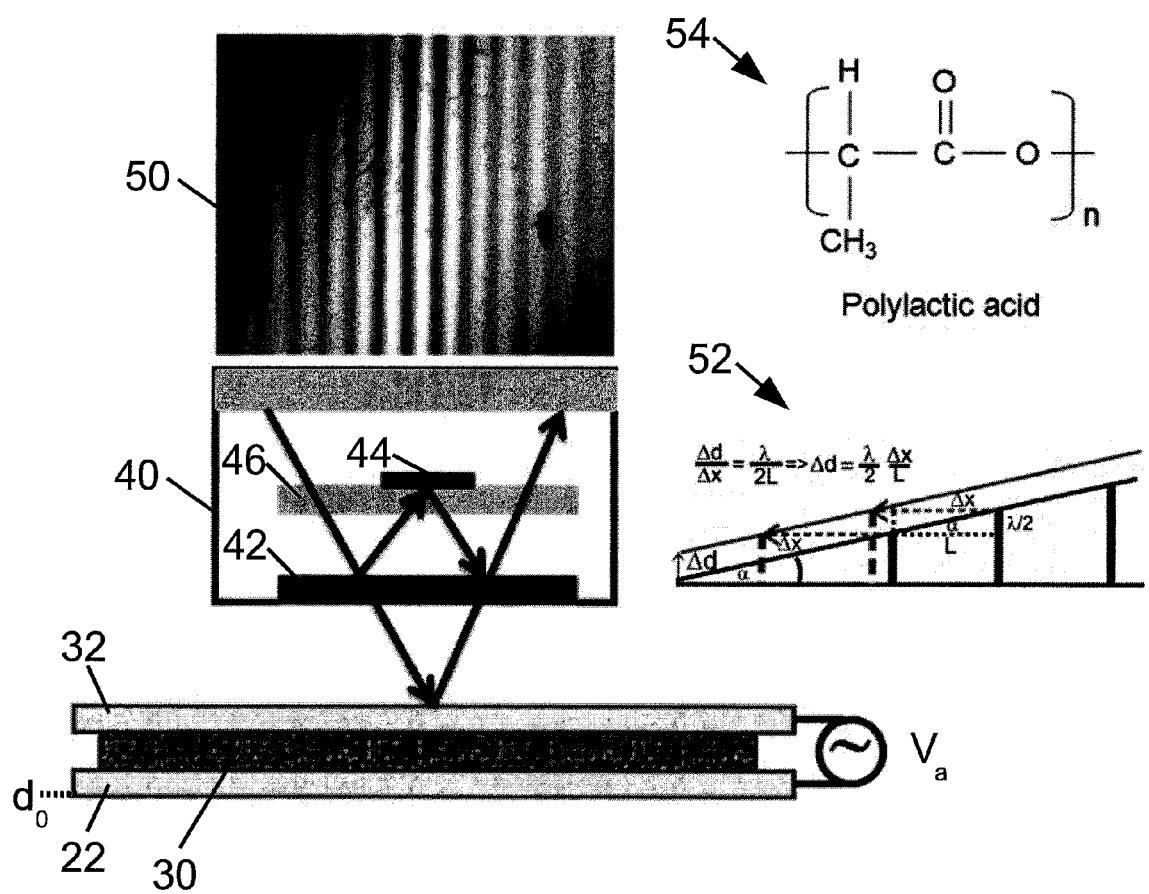
FIG. 8 diagrammatically shows an experimental setup employing a Mirau interferometer for measuring the converse effect of a test device configured as shown in FIG. 3.

With reference to FIG. 8, tests demonstrating the converse effect, that is, demonstrating generation of mechanical displacement in response to an applied voltage (see FIG. 3), are described. The test device comprises the fiber mat 30 of $PLA/BaTiO_3$ fibers formed by electrospinning as a nonwoven mat collected onto the ITO-glass substrate 22, with the second ITO-coated glass substrate 32 placed as a top-substrate forming a cell containing the fiber mat 30. The applied voltage $V_a$ is an a.c. voltage creating an a.c. electric field applied normal to the cell. The vertical position of the top substrate 32 was measured in reflection with a Leitz-Mirau Interferometer 40, which was mounted on an Olympus BX51 microscope (not shown). The bottom glass substrate 22 of the cell was fixed to the microscope stage in order to immobilize the bottom substrate 22 at the reference position $d_0$ so that only the top substrate 32 was able to move.

The Mirau interferometer 40 has a conventional setup including a semitransparent (i.e. partially reflective) mirror 42 and a reference mirror 44 in the center of an objective lens 46. When the Mirau interferometer 40 is focused upon the surface of the top substrate 32, as shown in FIG. 8, localized interference fringes will appear due to the reflected light. That is, interference patterns are created between the reflection reference mirror 44 in the center of the objective lens 46 and the top substrate 32. Cell compression or expansion due to the electric field produced by the applied voltage $V_a$ causes a shift in the interference pattern, which is recorded and analyzed.

For illustrative purposes, a typical interference pattern 50 acquired for cell including the fiber mat 30 and sandwiching substrates 22, 32 is shown above the Mirau interferometer 40, and a geometric representation 52 of the calculation of the output displacement Δd (this is $\Delta d_{out}$ of FIG. 3) is shown to the right of the Mirau interferometer 40. As shown in the geometric representation 52, the relevant relationship is:

$$\frac{\Delta d}{\Delta x} = \frac{\lambda}{2L} \rightarrow \Delta d = \frac{\lambda}{2} \frac{\Delta x}{L}$$

where λ is the wavelength of the light, L is the spacing of the interference fringes, and Δx is the shift in the interference pattern. In the geometric representation 52, the symbol α is also included, which denotes the tilt of a small-angle tilt of (the normal of) the top substrate 32 respective to the optical axis of the Mirau interferometer 40. Angle α affects fringe spacing L in the conventional manner. For further reference, FIG. 8 also includes a chemical structure 54 showing the molecular structure of PLA (polylactic acid).

With the experimental setup of FIG. 8, movement of the top glass substrate 32 was measured as a function of the amplitude, sign, and the a.c. frequency of the external voltage $V_a$ applied to the cell. A green filter (not shown) was utilized to measure field-dependent changes of the interference patterns found on the cell surface upon application of the field. Analysis was performed by counting the shift Δx of the interference fringes of green light.

In one experiment, comparisons were made between the BaTiO$_3$/PLA fiber mat 30 and an analogous neat electrospun PLA fiber mat (where "neat" indicates the fiber mat was electrospun from source material identical with the source material 10 shown in FIG. 1 except omitting the BaTiO$_3$ component). It was found within an experimental error of about 5 nm that neat PLA fibers show only compressions and no expansion (therefore no linear electromechanical response). Linear electromechanical responses (LEM) are sensitive to the sign of the external field, i.e. an external periodic field would result in mechanical vibrations at the same frequency. The absence of any measurable LEM response was somewhat surprising, because optically active PLA materials have been known to present shear piezoelectricity (which is an LEM effect) with the piezoelectric constant of 10 pC/N. However shear piezoelectricity would not cause any thickness changes, and shear piezoelectricity occurs only in highly oriented crystalline structure, which can be obtained by drawing treatment. Without being limited to any particular theory of operation, it is believed that the neat PLA fibers have low crystallinity as a result of rapid solidification in the electrospinning of the fluid jets at high solvent evaporation rates preventing the formation of ordered domains, and hence the neat PLA fiber mats formed by electrospinning do not exhibit significant LEM. The observation of only periodic compressions, i.e., a quadratic effect, in the neat PLA fiber mats formed by electrospinning indicates the observed behavior is attributable to an electrostriction. This is a property of all dielectric materials where the field induces an electric polarization that has a linear interaction of the field, thus leading to a strain proportional to the square of the applied electric field. See Fukada, "New piezoelectric polymers", Jpn. J. Appl. Phys. vol. 37 (Part 1, No. 5B), page 2775 (1998). In the experiments reported here, the largest quadradic electromechanical (QEM) effect was observed under d.c. fields. The electrostriction of the neat PLA fibers was reduced to about 30 nm by grounding the d.c. power supply and the collector plate 22 together. Additional heat treatment at 40° C., which is well below the glass transition temperature of PLA ($T_g$~59° C.), and exposing to water vapor further decreased the QEM effect by removing the excess charges deposited on the fiber surfaces during the electrospinning.

In another experiment, PLA/BaTiO$_3$ suspensions were directly casted onto an ITO-glass substrate (without using electrospinning), and subsequently, the solvent was removed to form a thin film. These films showed the lowest (~5-10 nm) QEM and LEM effects, which indicates that without the electrospinning both the electrostriction and piezoelectricity are not measurable in the measurement setup described with reference to FIG. 8.

Figure 9:
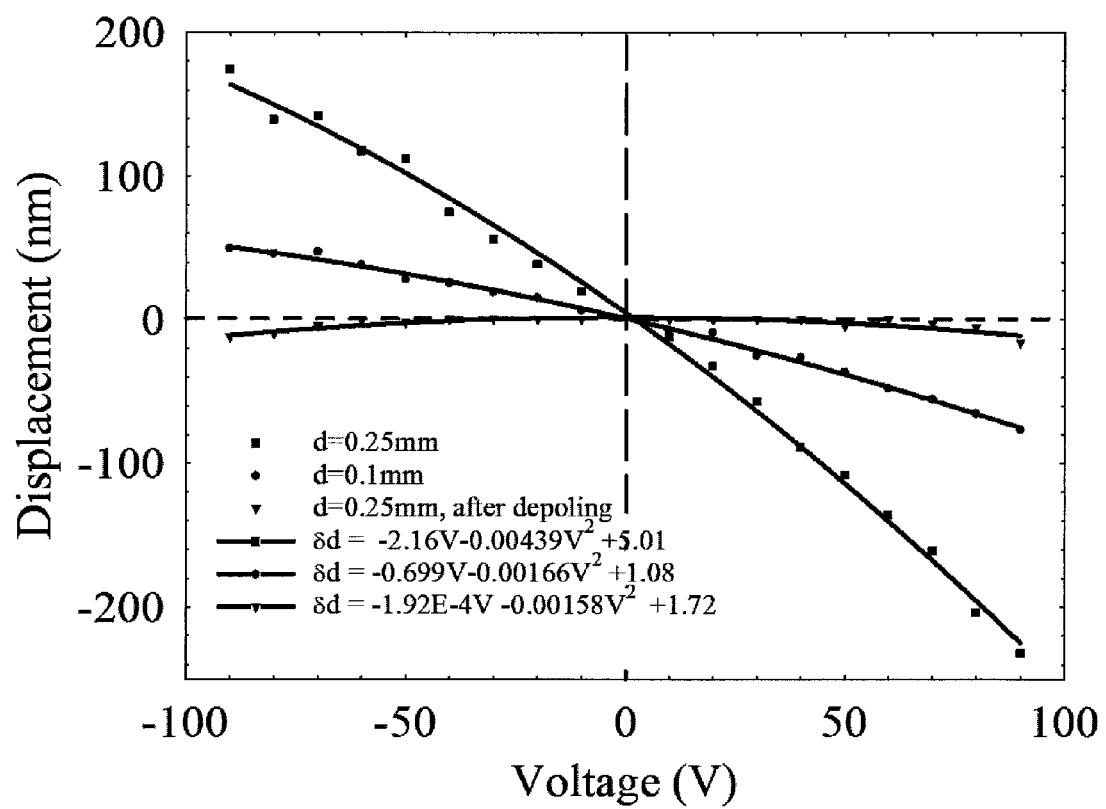
FIG. 9 plots measured displacement of the top plate of a test device configured as shown in FIG. 3 versus applied voltage where the displacement is obtained from interferometry analysis using the experimental setup of FIG. 8.

With reference to FIG. 9, results are shown for electromechanical studies on electrospun PLA/BaTiO$_3$ fiber mats. FIG. 9 plots measured displacement of the top plate 32 versus applied voltage $V_a$ obtained from interferometry analysis of the PLA/BaTiO$_3$ fiber mat 30 sandwiched between ITO-coated glass substrates 22, 32 using the experimental setup of FIG. 8.

In one experiment, electromechanical signals were studied after heating the non-woven PLA/BaTiO$_3$ mats over the Curie temperature of BaTiO$_3$ (about 100° C.), and cooling the sample back to room temperature. (The Curie temperature is the temperature where a material's permanent magnetism changes to induced magnetism.) The results showed mainly QEM signals and that the amplitude of the LEM vibration was decreased to a few nanometers indicating that the depolarizing effect reduces the LEM signals, but does not affect the QEM signals, which are believed to be due to surface charges. These results are plotted in FIG. 9 and are indicated by the legend including the notation "after depoling".

With continuing reference to FIG. 9, in other experiments, electrospun PLA/BaTiO$_3$ fiber mats 30 were studied that have never been heated above the Curie temperature ($T_C$) but that were grounded and treated by water vapor to remove the extra charges accumulated during the electrospinning process, or to screen out those bound charges that might have developed due to divergences of the electric polarization due to inhomogeneous fields. As seen in FIG. 9, the PLA/BaTiO$_3$ fiber mat 30 exhibits both expansion and compression under opposite polarity. The displacement of the fiber mat 30 measured at the center of the cell, which is obtained from video analysis of the interference pattern shift for green light, is linearly proportional to the magnitude and the sign of the applied voltage. This result represents linear electromechanical (LEM) properties of the PLA/BaTiO$_3$ fibers. As the spontaneous electric polarization of the ferroelectric BaTiO$_3$ particles is about P~0.15 C/m$^2$ and the typical surface charge density of electrospun fibers due to electrospinning is only in the range of $10^{-5}$ nC/m$^2$ (as reported in Kalayci et al., Polymer vol. 46, pages 71791-72000 (2005)) even without the water vapor treatment, and because the surface charge density contributes only to the quadratic electromechanical signal, the role of the surface charges can be neglected in interpreting the LEM results. Similarly, possible bound charges that may result from non-homogeneous electric fields can be excluded, because they would appear only in QEM signals. Accordingly, the effect should be related to the piezoelectricity of the ferroelectric nanoparticles.

Using longer electrospinning times yields thicker fiber mats. In further experiments, about 0.2-0.5 mm thick mats showed even higher displacements (about 400-500 nm thickness variations) as the voltage was changed from −90V to +90V. These experiments indicate that the displacement is almost proportional to the film thickness, which is basically proportional to the spinning time.

Figure 10:
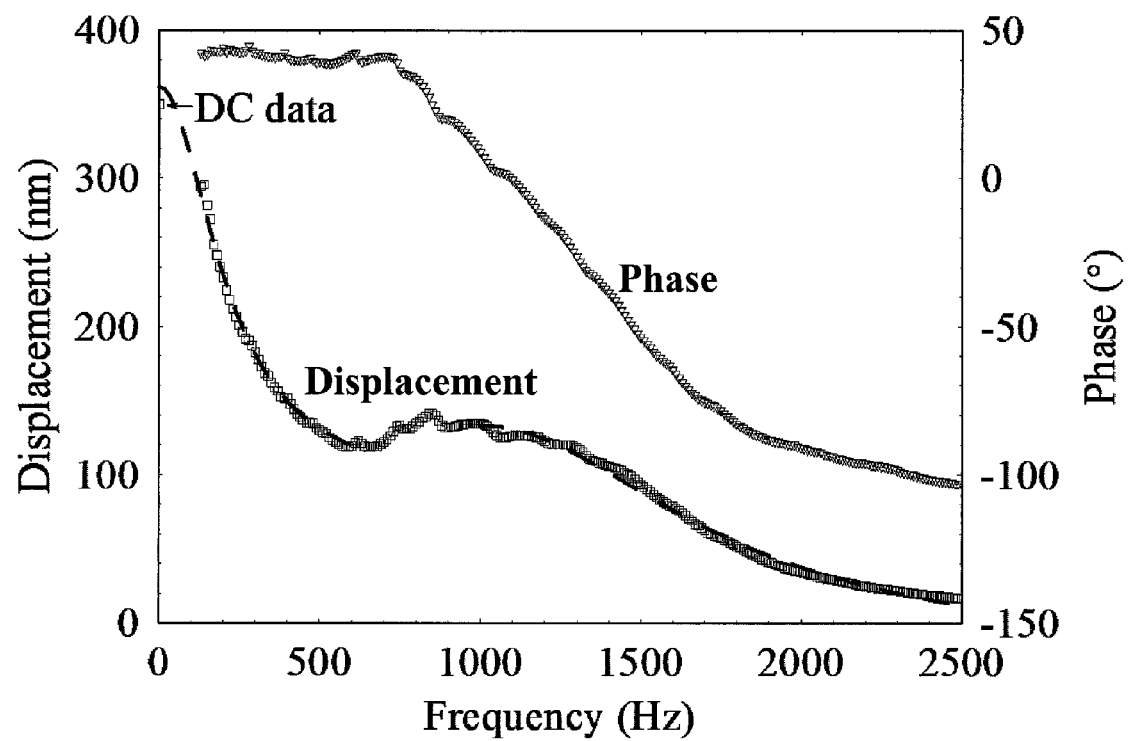
FIG. 10 shows experimental results for the frequency response of the converse effect by plotting displacement and phase versus frequency of the applied voltage.

With reference to FIG. 10, experimental results for the frequency response of the converse effect are shown by plotting displacement (in nm) and phase (in degrees) versus frequency of the applied voltage $V_a$. The displacement at d.c. voltage is also indicated.

Advantageously, the PLA/BaTiO$_3$ fiber mats 30 exhibit a compression and bending modulus ($Y\sim10^4$ N/m$^2$) comparable to those of biological cell tissues, which provides matching mechanical impedances with such tissues that provide the highest efficiency. These soft actuators therefore are much more compatible with biological applications as compared with hard piezoelectric actuators, which are the type of actuators typically commercially available.

Figure 11:
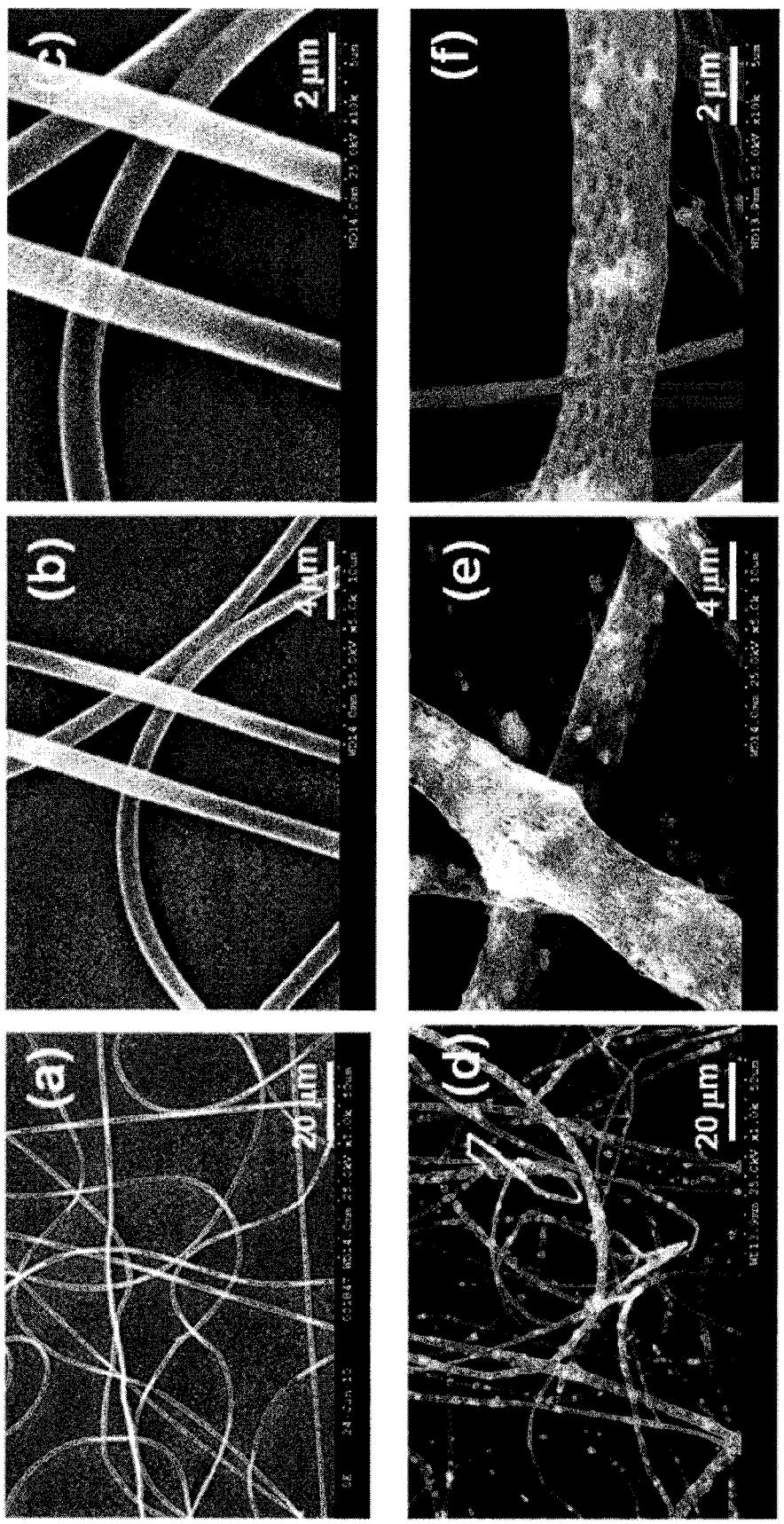
FIG. 11 shows six scanning electron microscope (SEM) micrographs labeled (a)-(f), respectively, where micrographs (a)-(c) are of neat PLA fibers and micrographs (d)-(f) are of PLA/BaTiO$_3$ fibers.

With reference to FIG. 11, morphology and polarizing microscopy studies of electrospun PLA/BaTiO$_3$ fiber mats 30 compared with neat PLA fiber mats are described. FIG. 11 show six scanning electron microscope (SEM) micrographs labeled (a)-(f), respectively. SEM micrographs (a)-(c) are of neat PLA fibers (electrospun at 20 kV, 10 cm, and 0.6 mL/h), while SEM micrographs (d)-(f) are of PLA/BaTiO$_3$ fibers (electrospun at 20 kV, 10 cm, and 0.4 mL/h). The neat PLA and PLA/BaTiO$_3$ fibers are electrospun from their solutions in chloroform/acetone as previously described with reference to FIG. 1. Even though both neat PLA and PLA/BaTiO$_3$ fibers were electrospun at E=20 kV/10 cm electric fields, the morphology and variation in diameters of the fibers are very different. The neat PLA fibers shown in SEM micrographs (a)-(c) are a uniform ~2 μm thick and possess very uniform and nonporous surface topology with no bead defects. On the other hand, very porous surface structure was obtained for the PLA/BaTiO$_3$ fibers, as seen in SEM micrographs (d)-(f).

Without being limited to any particular theory of operation, the surface structure of the PLA/BaTiO$_3$ fibers seen in SEM micrographs (d)-(f) is believed to be due to the following. The ferroelectric BaTiO$_3$ particles are spatially confined and form microdomains within the PLA matrix. Apparently, particles were carried and trapped by the long molecular chains of PLA as the solvent evaporates during electrospinning process. The microphase separated BaTiO$_3$ particles in the electrospun fibers lack any long-range order. It is seen that the PLA/BaTiO$_3$ fiber size varies between 200 nm to 2.5 μm. The fiber size change and the appearance of the porosity (as compared with comparable electrospun neat PLA fibers, e.g. micrographs (a)-(c)) can be attributed to the viscosity change of the PLA solution and by the nanophase separation due to the addition of the BaTiO$_3$ particles. See Greiner et al., "Electrospinning: A Fascinating Method for the Preparation of Ultrathin Fibers", Angew. Chem. Int. Ed. 46, pages 5670-5703 (2007); Lim et al., "Processing technologies for poly (lactic acid)", Progress in Polymer Science vol. 33, pages 820-852 (2008). The increase in fiber diameter with higher viscosity has been reported for PLA (Xiang et al., "Nanocomposite Fibers Electrospun from Poly(lactic acid)/Cellulose Nanocrystals", J. Biobased Materials and Bioenergy vol. 3 no. 2, pages 1-9 (2009)) as well as for several other electrospun polymeric fibers. Reneker et al., "Electrospinning jets and polymer nanofibers", Polymer vol. 49, pages 2387-2425 (2008). The uneven distribution of the nanoparticles and their agglomerates in PLA matrix may also contribute to the polymer-rich and polymer-poor regions and lead to the formation of porous fibers by increasing crystallinity and inhibiting the PLA chain mobility. It has also been reported that the use of multi-solvent systems for PLA spinning is one of the important parameters to manipulate the surface topography of the fibers. Bognitzki et al., "Nanostructured Fibers via Electrospinning", Adv. Mater. vol. 13, pages 70-72 (2001).

With returning reference to FIG. 9, from the slopes of the plots in FIG. 9 it can be seen that an applied voltage of 100V results in 70 nm-200 nm displacement of the cover glass 32, corresponding to a piezoelectric constant $d_{33}$=0.7-2 nV/m, which is four to ten time (4-10 times) larger than the largest literature data of $d_{33}$=180 pm/V for continuous BaTiO$_3$ films. (Reported in Wada et al., Jpn. J. Appl. Phys. vol. 38, pages 5505-551 (1999)). Without being limited to any particular theory of operation, the "super-piezoelectricity" of the disclosed electrospun PLA/BaTiO$_3$ fiber mats 30 is believed to be explained by the following proposed physical model.

With returning reference to FIG. 1, the physical model is based in part on the following observation. In order that the piezoelectric response of BaTiO$_3$ nanoparticles not to be averaged out, their ferroelectric polarization has to be aligned. The aligning mechanism (poling) is believed to be provided by the electrospinning process as follows. The electric field $$E = \frac{V}{L} = \frac{20 \text{ kV}}{10 \text{ cm}} \sim 2 \times 10^5 \text{ V/m}$$

for a typical fiber mat deposition having the voltage source 16 operated at 20 kV. This electric field E is believed to rotate the polarization of the individual BaTiO$_3$ particles while they are suspended in the solvent, as they are relatively free to rotate with their polarization along the field while in the solvent. It is known that during the second part of the electrospinning process the fibers suffer an electric field-induced bending instability (see Yarin et al., J. Appl. Phys. vol. 89 page 3018 (2001)), which means that at the time when the fiber hits the collection plate it is already perpendicular to the electric field. So, even if the solvent evaporation does not take longer than the flight time of the jet, the BaTiO$_3$ particles are expected to end up poled with almost uniform electric polarization perpendicular to the field. In FIG. 1, this poling of the BaTiO$_3$ particles is indicated by arrows. Thus, the resulting PLA/BaTiO$_3$ fiber mat 30 is expected to have a net polarization normal to the collection substrate 22.

Figure 12:
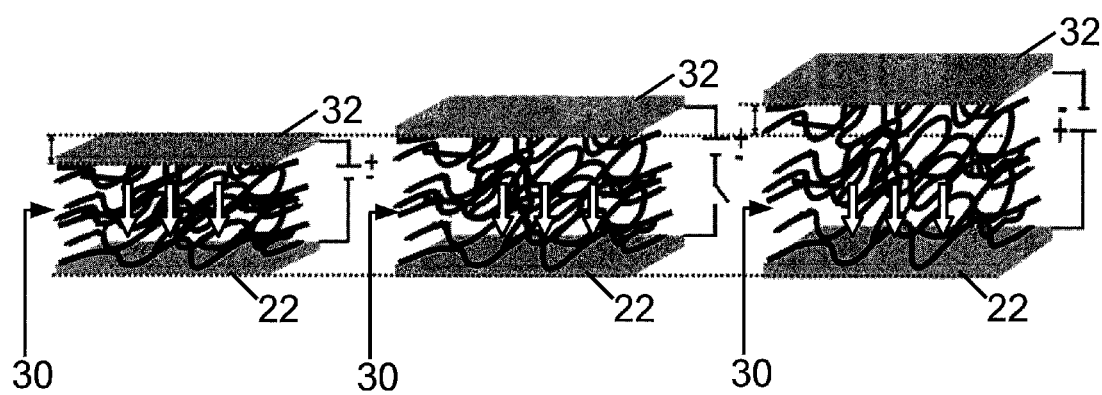
FIG. 12 diagrammatically shows a converse effect experiment, where: the middle diagram shows the device with no applied electric field; the left-hand diagram shows the device with an external electric field applied parallel with the polarization of the BaTiO$_3$ nanoparticles; and the right-hand diagram shows the device with an external electric field applied anti-parallel with the polarization of the BaTiO$_3$ nanoparticles.

With reference now to FIG. 12, in consequence in the cell with the fiber mat 30 sandwiched between the substrates 22, 32, the voltage applied across the ITO plates of the substrates 22, 32 generates an electric field that is parallel to the polarization of the ferroelectric nanoparticles. This poling is indicated by arrows in the diagrammatic converse effect experiment (i.e. applied voltage induces displacement) shown in FIG. 12. The middle diagram of FIG. 12 shows the device with no applied electric field (due to the switch being open). The left-hand diagram of FIG. 12 shows the (converse) piezoelectric response when the external field is applied parallel with the polarization of the BaTiO$_3$ nanoparticles. The effect is to compress the PLA/BaTiO$_3$ fiber mat 30. The right-hand diagram of FIG. 12 shows the (converse) piezoelectric response when the external field is applied anti-parallel with the polarization of the BaTiO$_3$ nanoparticles. The effect is to expand the PLA/BaTiO$_3$ fiber mat 30.

Due to the piezoelectricity, the nanoparticles will extend their size along the electric field when the polarization $\vec{P}$ is parallel to the applied electric field $\vec{E}$; and conversely will decrease their size when the polarization $\vec{P}$ is anti-parallel to the applied electric field $\vec{E}$ (or other way around, depending on the sign of the piezoelectric constant).

To get a quantitative estimate of the effect, the volume is first calculated of the solution spun in about 5 minutes that provided a 100 μm thick mat. From the 0.4 cm³/hour flow rate and 5 min electrospinning time, the total volume of the solvent is estimated to be $V_s=3.2\times10^{-2}$ cm³. Taking into account that the fiber composite material is 10 wt-% of the total material with 1.3 g/cm³ of the solvent and 3.5 g/cm³ for the composite, it is found that only 4.2% of the volume will remain in the mat, with the remainder evaporating away. Accordingly the total volume of the fiber mat is estimated to be $1.4\times10^{-3}$ cm³ or, converted to cubic millimeters, the volume of the fiber mat is 1.4 mm³. This corresponds to 4.9 mg of fiber mass with 2.4 mg of BaTiO₃ and 2.5 mg of PLA. This corresponds to $V_{NP}=0.41\times10^{-9}$ m³ volume of nanoparticles (where in the following, the subscript "NP" denotes the BaTiO₃ nanoparticles, and the subscript "f" denotes the fibers). Assuming smooth cylindrical fibers, it follows:

$$l \cdot R_{NP}^2 \pi = V_{NP} = 4.1\times10^{-10} \text{ m}^3$$

and $$l \cdot R_f^2 \pi = V_f = 1.4\times10^{-9} \text{ m}^3$$

In these equations l is the total length of the fibers, $R_f$ is the radius of the fiber, and $R_{NP}$ is the effective radius of the nanoparticles assuming they are making continuous chains inside the fibers. Dividing the above two equations yields $R_{NP}=0.54 \cdot R_f$. Taking $\langle R_f \rangle=0.3$ μm as an average fiber radius and $\langle R_{NP} \rangle=0.16$ μm yields l=4800 m. For this enormously large length, the total surface area perpendicular to the electric polarization is estimated to be about 16.8 cm², which is four (4) times larger than of the 4 cm² surface area of the collector substrate 22. Since the nanoparticles are insulated by the PLA material, and the electric field-induced thickness change ΔL depends only on the applied voltage $V_a$, and not the thickness, as $\Delta L = d_{33} \cdot V_a$, this situation corresponds to basically four BaTiO₃ films in series, but experiencing the same voltage as does the whole fiber mat 30. This is in agreement with the observed variation of the 0.1 mm film shown in FIG. 7. Although the magnitude of the magnification depends on a number of parameters, within the measuring error the observed three times larger effective piezoelectricity illustrates that the above model accounts fairly well for the observed super-piezoelectricity of the nano-composite fiber mats 30 over the much lower piezoelectricity of the pure BaTiO₃ material. In addition, taking into account the porous nature of the PLA/BaTiO₃ fibers shown in FIG. 11 micrographs (d)-(f), the surface areas should be proportional to the electrospinning time, i.e. with the thickness of the PLA/BaTiO₃ fiber mat 30.

Disclosed herein are stimuli-responsive electrospun fiber mats that incorporate ferroelectric barium titanate nanoparticles. Experiments reported herein show that the linear electromechanical responses of the fiber mats have orders of magnitudes larger effective piezoelectric coupling constant of the composite fiber mat as compared with pure BaTiO₃. Compared to PVDF based polymer sheets, the response is 10 times larger for the disclosed electrospun PLA/BaTiO₃ fiber mat. This super-piezoelectricity is believed to be due to effective poling of the BaTiO₃ particles during the electrospinning deposition, and is further believed to be due to the increased effective surface area of the ferroelectric nanoparticles.

The actually fabricated piezoelectric fiber mats were fabricated by electrospinning using barium titanate (BaTiO₃) particles as the piezoelectric particles. According to the physical model proposed herein, the use of electrospinning in the fiber mat fabrication produces characteristic structure in the deposited fiber mat including (in addition to conventional characteristics of electrospun fiber mats, such as generally random orientation of the fibers, retention of the polymer matrix and evaporation of the solvent, and so forth) self-poling of the BaTiO₃ particles. This self-poling is expected to occur for other types of ferroelectric particles which may be substituted for barium titanate in the solution 10 (see FIG. 1), and thus substantially any fiber mat electrospun from source material comprising ferroelectric particles dispersed in a polymer matrix in a solvent are expected to exhibit the disclosed super-piezoelectric characteristics, albeit possibly to a greater or lesser degree depending upon properties of the specific ferroelectric particles employed.

Other fiber mat deposition techniques are also contemplated, such as centrifugal spinning (sometimes called force spinning). In such techniques, it is contemplated to apply an electric field during the deposition to provide self-poling of the ferroelectric particles. However, even if such an electric field is not provided, it is expected that a substantial enhancement of the piezoelectric effect may be obtained in such polymer/ferroelectric particle fiber mats by action of the second aspect of the proposed physical model, namely the increased effective surface area of the ferroelectric nanoparticles.

The disclosed fiber mat with its demonstrated super-piezoelectricity offers an effective and light-weight element for producing electric power from a mechanical input, sufficient to switch a LCD display. With stacking of the fiber mats, the potential to power light emitting diodes (LEDs) can also be realized. The converse effect (conversion of electrical input to mechanical displacement) has also been demonstrated. This effect may, for example, be used to employ the disclosed fiber mat for a bio-compatible soft actuator. Such an application leverages the observation that the disclosed PLA/BaTiO₃ fiber mats 30 have compression and bending modulus values comparable to those of biological cell tissues, which provides matching mechanical impedances for the bio-compatible soft actuator. The disclosed piezoelectric devices have numerous additional applications, such as: sound transducers in audio speakers; pressure sensors; touch-sensitive buttons; active Braille cells; liquid crystal writing tablets; vibration sensors; and so forth.

It will be appreciated that various arrangements of the above-disclosed and other features and functions, or alternatives thereof, may be desirably combined into many other different systems or applications. It will be further appreciated that various presently unforeseen or unanticipated alternatives, modifications, variations or improvements therein may be subsequently made by those skilled in the art which are also intended to be encompassed by the following claims.

The invention claimed is:

1. An apparatus comprising:
   a piezoelectric device including:
      a fiber mat comprising polymer fibers with ferroelectric particles embedded in the polymer fibers, the polymer material of the polymer fibers electrically insulating the embedded ferroelectric particles; and
      electrically conductive substrates sandwiching the fiber mat.

2. The apparatus of claim 1 wherein the ferroelectric particles embedded in the polymer fibers comprise micro-domains of ferroelectric particles in the polymer fibers.

3. The apparatus of claim 1 wherein the ferroelectric particles embedded in the polymer fibers are poled such that the fiber mat has a net polarization $\vec{P}$ oriented normal to surfaces of the electrically conductive substrates.

4. The apparatus of claim 1 wherein the ferroelectric particles comprise barium titanate particles.

5. The apparatus of claim 4 wherein the polymer fibers comprise polylactic acid (PLA) fibers.

6. The apparatus of claim 4 wherein the fiber mat is formed by electrospinning polymer fibers containing barium titanate particles onto one of the electrically conductive substrates.

7. The apparatus of claim 1 wherein the fibers of the fiber mat lack any long-range order.

8. The apparatus of claim 1 wherein the fiber mat is formed by electrospinning polymer fibers containing ferroelectric particles onto one of the electrically conductive substrates.

9. The apparatus of claim 1 wherein the piezoelectric device comprises a piezoelectric actuator configured to receive an input voltage and output a mechanical displacement in response to the received input voltage.

10. The apparatus of claim 1 wherein the piezoelectric device is configured to output a voltage in response to an applied mechanical force.

11. An apparatus comprising:
a piezoelectric device including:
a fiber mat comprising polymer fibers with ferroelectric particles embedded in the polymer fibers, the polymer material of the polymer fibers electrically insulating the embedded ferroelectric particles; and
electrically conductive substrates sandwiching the fiber mat;
wherein the electrically conductive substrates include at least one substrate comprising glass coated with indium tin oxide (ITO).

12. The apparatus of claim 11 wherein the polymer material of the polymer fibers electrically insulates the embedded ferroelectric particles.

13. An apparatus comprising:
a piezoelectric device including an electrospun fiber mat comprising polymer fibers with ferroelectric particles embedded in the polymer fibers;
wherein the polymer fibers electrically insulate the embedded ferroelectric particles; and
wherein the ferroelectric particles are oriented to generate a net polarization in the fiber mat.

14. The apparatus of claim 13 wherein the ferroelectric particles embedded in the polymer fibers comprise microdomains of ferroelectric particles in the polymer fibers.

15. The apparatus of claim 13 wherein the ferroelectric particles comprise barium titanate particles.

16. The apparatus of claim 15 wherein the polymer fibers comprise polylactic acid (PLA) fibers.

17. The apparatus of claim 15 wherein the piezoelectric device further includes substrates sandwiching the fiber mat, and the fiber mat is formed by electrospinning polymer fibers containing barium titanate particles onto one of the substrates.

18. The apparatus of claim 13 wherein the fibers of the fiber mat lack any long-range order.

19. The apparatus of claim 13 wherein the piezoelectric device further includes substrates sandwiching the fiber mat, and the fiber mat is formed by electrospinning polymer fibers containing ferroelectric particles onto one of the substrates.

20. The apparatus of claim 13 wherein the piezoelectric device comprises a piezoelectric actuator configured to receive an input voltage applied across the fiber mat and to output a mechanical displacement in response to the voltage applied across the fiber mat.

21. The apparatus of claim 13 wherein the piezoelectric device is configured to output a voltage in response to a mechanical force applied to the fiber mat.

* * * * *